United States Patent
Mo et al.

(10) Patent No.: US 9,502,498 B2
(45) Date of Patent: Nov. 22, 2016

(54) POWER SEMICONDUCTOR DEVICE

(71) Applicant: Samsung Electro-Mechanics Co., Ltd., Suwon-si (KR)

(72) Inventors: Kyu Hyun Mo, Suwon-si (KR); Dong Soo Seo, Suwon-si (KR); Chang Su Jang, Suwon-si (KR); Jae Hoon Park, Suwon-si (KR); In Hyuk Song, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/617,158

(22) Filed: Feb. 9, 2015

(65) Prior Publication Data

US 2016/0013268 A1 Jan. 14, 2016

(30) Foreign Application Priority Data

Jul. 8, 2014 (KR) ........................ 10-2014-0085052

(51) Int. Cl.
*H01L 29/66* (2006.01)
*H01L 29/06* (2006.01)
*H01L 29/78* (2006.01)
*H01L 29/423* (2006.01)

(52) U.S. Cl.
CPC ..... *H01L 29/0634* (2013.01); *H01L 29/42356* (2013.01); *H01L 29/7827* (2013.01)

(58) Field of Classification Search
CPC .......... H01L 29/0634; H01L 29/7827; H01L 29/42356
See application file for complete search history.

(56) References Cited

U.S. PATENT DOCUMENTS

| | | | | |
|---|---|---|---|---|
| 7,238,576 B2* | 7/2007 | Yamaguchi | ......... | H01L 29/0634 257/342 |
| 2011/0306191 A1* | 12/2011 | Ohi | ..................... | H01L 29/0634 438/495 |
| 2012/0061721 A1* | 3/2012 | Kimura | ............... | H01L 29/0634 257/133 |
| 2012/0074491 A1* | 3/2012 | Ohta | ................... | H01L 29/0634 257/334 |
| 2013/0069158 A1* | 3/2013 | Ohta | ................. | H01L 29/66712 257/342 |
| 2014/0110779 A1* | 4/2014 | Tamaki | ............. | H01L 29/66727 257/330 |

FOREIGN PATENT DOCUMENTS

KR  10-2012-0060324 A  6/2012

* cited by examiner

*Primary Examiner* — Victor A Mandala
(74) *Attorney, Agent, or Firm* — NSIP Law

(57) ABSTRACT

A power semiconductor device may include a first conductivity type semiconductor substrate, a super-junction portion disposed on the first conductivity type semiconductor substrate and including a first conductivity type pillar and a second conductivity type pillar arranged in an alternating manner, and a three-dimensional (3D) gate portion disposed on the first conductivity type pillar. The 3D gate portion is disposed on the first conductivity type pillar to reduce the widths of the first and second conductivity type pillars, thereby effectively reducing a device size.

11 Claims, 5 Drawing Sheets

POWER SEMICONDUCTOR DEVICE

CROSS-REFERENCE TO RELATED APPLICATION

This application claims the priority and benefit of Korean Patent Application No. 10-2014-0085052 filed on Jul. 8, 2014, with the Korean Intellectual Property Office, the disclosure of which is incorporated herein by reference.

BACKGROUND

The present disclosure relates to a power semiconductor device.

In general, power semiconductor devices are widely used as switching devices in inverters, control units, as well as other elements of motors.

In detail, power semiconductor devices are semiconductor devices used in power apparatuses, commonly optimized for controlling or converting power.

Compared with general semiconductor devices, power semiconductor devices commonly have high withstand voltage characteristics, high current characteristics, and a high frequency.

A representative example of a power semiconductor device includes a metal oxide semiconductor field effect transistor (MOSFET), an insulated gate bipolar transistor (IGBT), and other elements.

The trade-off between a withstand voltage and on-resistance of power semiconductor devices may be satisfied. Here, there may be limits, in that the trade-off may be determined according to a material of a semiconductor device. Thus, there is a need to overcome trade-off limitations to allow a semiconductor device with low on-resistance to be manufactured.

As an example of a power semiconductor device structure for solving this problem, a super-junction portion in which a p-type pillar and an n-type pillar are embedded has been proposed.

When a super-junction portion is used in a power semiconductor device, on-resistance of a semiconductor device may be improved by reducing the widths of a p-type pillar and an n-type pillar, but the power semiconductor device may be more sensitive to changes in design and processing conditions, as the width of the pillar is reduced.

In order to reduce the width of the pillar, it is necessary to increase the number of epitaxial growth processes or to perform additional processes, and thus, device characteristics may be degraded and a yield may be lowered due to high process costs and increased process complexity.

To solve this problem, there has been a need for the development of technology for reducing the width of pillars and device size while increasing channel density of a power semiconductor device and minimizing on-resistance.

The following related art document relates to a power semiconductor device having a super-junction portion.

RELATED ART DOCUMENT

Korean Patent Laid-Open Publication No. 10-2012-0060324

SUMMARY

An exemplary embodiment in of the present disclosure may provide a power semiconductor device.

According to an exemplary embodiment in the present disclosure, a power semiconductor device may include a first conductivity type semiconductor substrate, a super-junction portion disposed on the first conductivity type semiconductor substrate and including a first conductivity type pillar and a second conductivity type pillar arranged in an alternating manner, and a three-dimensional (3D) gate portion disposed on the first conductivity type pillar.

According to another aspect of the present disclosure, a power semiconductor device may include a first conductivity type semiconductor substrate, a super-junction portion disposed on the first conductivity type semiconductor substrate and including a first conductivity type pillar and a second conductivity type pillar arranged in an alternating manner, and a path provider disposed on the first conductivity type pillar and allowing electrons to move in a direction perpendicular with respect to the first conductivity type semiconductor substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
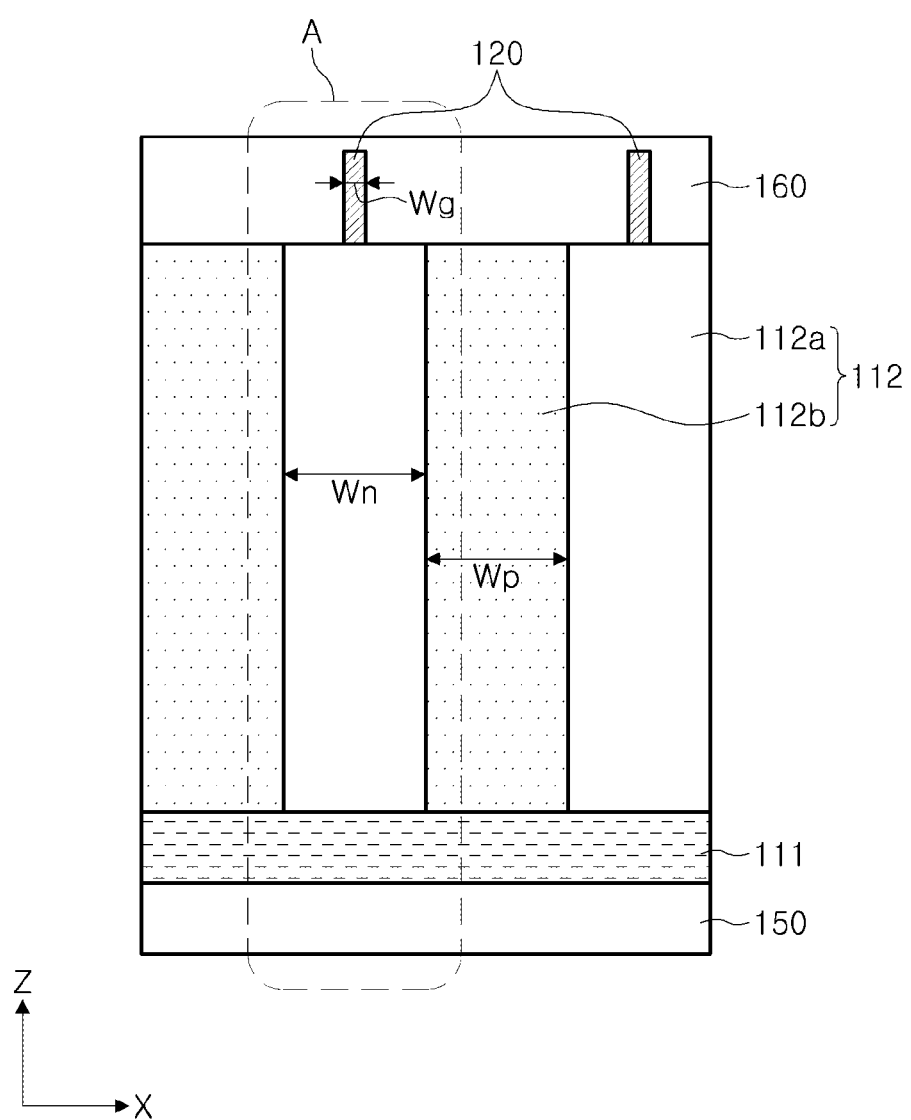
FIG. 1 is a schematic cross-sectional view of a power semiconductor device according to an exemplary embodiment in the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the drawings, an x direction, a y direction, and a z direction are defined as a width direction, a length direction, and a thickness direction, respectively.

A power switch may be implemented as a power metal oxide semiconductor field effect transistor (MOSFET), a power insulated gate bipolar transistor (IGBT), various types of thyristors, and a device similar thereto. Most new technologies described herein will be described in terms of a MOSFET. However, exemplary embodiments herein may not be limited to a MOSFET and may also be applied to other types of power switch technologies including a power IGBT and various types of thyristors in addition to the MOSFET. In addition, exemplary embodiments of the present disclosure herein will be described as including specific p-type and n-type regions, but exemplary embodiments of the present disclosure may also be applied to a variety of devices having conductivity-type regions opposite thereto.

The n-type and p-type used herein may be defined as a first conductivity type or a second conductivity type. The first conductivity type and the second conductivity type refer to different conductivity types.

In general, '+' refers to a relatively high doping concentration and '−' refers to a relatively low doping concentration. Hereinafter, for clarity of description, the first conductivity type and the second conductivity type are referred to as an n-type and a p-type, respectively, but are not limited thereto.

Hereinafter, for clarity of description, a first conductivity type pillar, a second conductivity type pillar, a first semiconductor region, and a second semiconductor region will be described as an n-type pillar, a p-type pillar, a well region, and a source region, respectively, but are not limited thereto.

Figure 2:
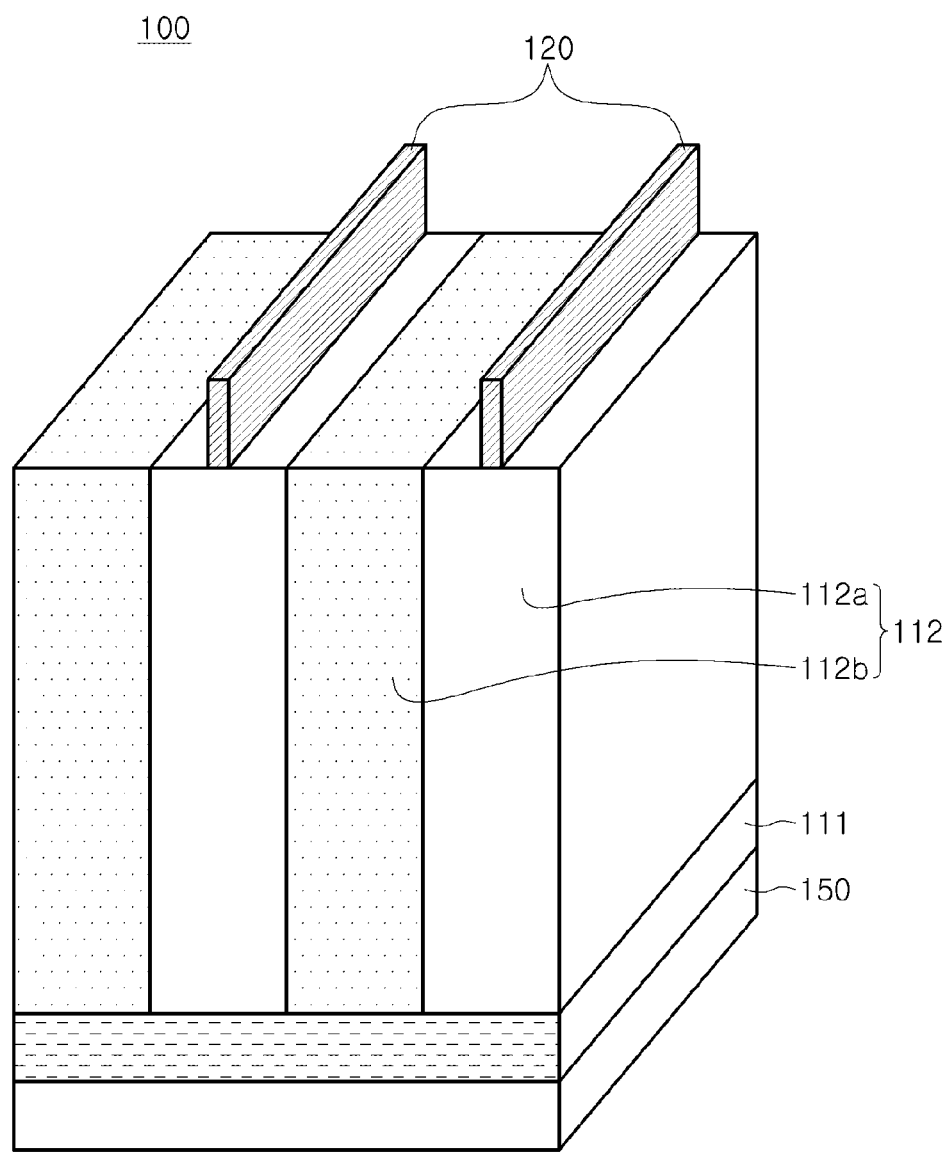
FIG. 2 is a schematic perspective view of a power semiconductor device according to an exemplary embodiment in the present disclosure.

FIG. 1 is a schematic cross-sectional view of a power semiconductor device 100 according to an exemplary embodiment in the present disclosure. FIG. 2 is a schematic perspective view of the power semiconductor device 100 according to an exemplary embodiment in the present disclosure.

Referring to FIGS. 1 and 2, the power semiconductor device 100 according to an exemplary embodiment in the present disclosure may include a first conductivity type semiconductor substrate 111, a super-junction portion 112 disposed on the first conductivity type semiconductor substrate 111 and including an n-type pillar 112a and a p-type pillar 112b arranged in an alternating manner, and a three-dimensional (3D) gate portion 120 disposed on the n-type pillar 112a.

The first conductivity type semiconductor substrate 111 may be provided as an n conductivity type substrate.

The super-junction portion 112 may be disposed on the first conductivity type semiconductor substrate 111 and may include an n conductivity type impurity region (an n-type pillar) and a p conductivity type impurity region (a p-type pillar) that are alternately formed in a width direction, an X direction.

The width of each of the n-type pillar 112a and the p-type pillar 112b may be in the range of 6 to 8 µm.

The power semiconductor device 100 may be, but is not limited to, a MOSFET.

The power semiconductor device 100 is required to be configured such that, during flow of current by applying forward bias thereto, when reverse bias is applied thereto via a switching operation, current should be blocked from flowing through the power semiconductor device 100.

The power semiconductor device 100 has little to no loss of switching performance and has little to no turn-off loss, unlike in the case of an IGBT.

At the moment when reverse bias is applied to the power semiconductor device, a channel is removed in the device such that no electrons move therein, and the remaining electrons in the device are moved in a direction toward a drain to then be removed.

Thus, the n-type pillar 112a may provide a path for allowing for rapid movement of electrons in a direction toward a drain.

Accordingly, the super-junction portion 112 may provide the path for allowing electrons to rapidly flow in a direction toward a drain through an n-type pillar, and simultaneously, may extend a depletion layer so as to increase withstand voltage characteristics of the device by a junction structure of the n-type pillar and the p-type pillar.

Accordingly, the power semiconductor device 100 according to an exemplary embodiment in the present disclosure may have little to no turn-off loss and may have significantly improved withstand voltage characteristics.

When a power semiconductor device operates in a blocking mode, a depletion layer formed at a portion in which a p-type semiconductor region and an n-type semiconductor region contact each other is extended.

The depletion layer is gradually extended as a voltage level of a blocking mode is increased.

The n-type pillar 112a and the p-type pillar 112b contact each other in the super-junction portion 112, and thus the depletion layer is also extended in the super-junction portion 112.

When a voltage is low early in the blocking mode, the depletion layer is extended in the width direction at an interface between the n-type pillar 112a and the p-type pillar 112b contacting each other.

However, when a voltage that exceeds a withstand voltage level or limiting voltage of the blocking mode is applied to a power semiconductor, avalanche breakdown is caused in the power semiconductor such that a relatively large amount of current flows in a reverse direction to cause breakdown of the device.

Accordingly, in order to enhance withstand voltage characteristics of the power semiconductor device, a room in which the depletion layer may be sufficiently extended may be required.

Widths of the n-type pillar and the p-type pillar Wn and Wp may be reduced. Thus, a distance between contact surfaces of the n-type pillar 112a and the p-type pillar 112b may be reduced and the length of a portion in which a depletion region meets the n-type pillar 112a and the p-type pillar 112b may be reduced, thereby reducing on-resistance of the power semiconductor device 100.

Even in a case in which the n-type pillar and the p-type pillar have higher doping concentration than that of a general power semiconductor device, withstand voltage characteristics of the power semiconductor device may be maintained or enhanced.

A level of on-resistance of a power semiconductor device including the super-junction portion 112 applied thereto is proportional to the widths Wn and Wp of the n-type pillar and the p-type pillar and is inversely proportional to doping concentration of the n-type pillar and the p-type pillar.

Thus, when the widths of the n-type pillar and the p-type pillar Wn and Wp are reduced and doping concentrations of the n-type pillar and the p-type pillar are enhanced, on-resistance of the power semiconductor device 100 may be reduced while maintaining withstand voltage characteristics.

In the power semiconductor device 100 according to an exemplary embodiment in the present disclosure, the 3D gate portion 120 is disposed on the n-type pillar 112a.

The 3D gate portion 120 may be formed on the n-type pillar 112a to be elongated in one direction.

One or more 3D gate portions 120 may be disposed on the n-type pillar 112a.

The 3D gate portion 120 may be formed to be disposed within a width range of the n-type pillar 112a.

Thus, an area of a channel region may be increased in the power semiconductor device and channel density may be increased.

A width Wg of the 3D gate portion 120 may be equal to or less than 1 µm.

When the width Wg of the 3D gate portion 120 is equal to or less than 1 μm, the widths of the n-type pillar and the p-type pillar Wn and Wp may be significantly reduced.

When the widths of the n-type pillar and the p-type pillar Wn and Wp are reduced while increasing the doping concentrations of the n-type pillar and the p-type pillar, even in a case in which a distance between the contact surfaces of the n-type pillar 112a and the p-type pillar 112b is reduced, withstand voltage characteristics of the power semiconductor device may be maintained or enhanced and on-resistance of the power semiconductor device may be reduced.

For example, as the 3D gate portion 120 is disposed on the n-type pillar 112a, the widths of the n-type pillar and the p-type pillar Wn and Wp may be reduced, thereby effectively reducing a device size and increasing integration density.

Figure 3:
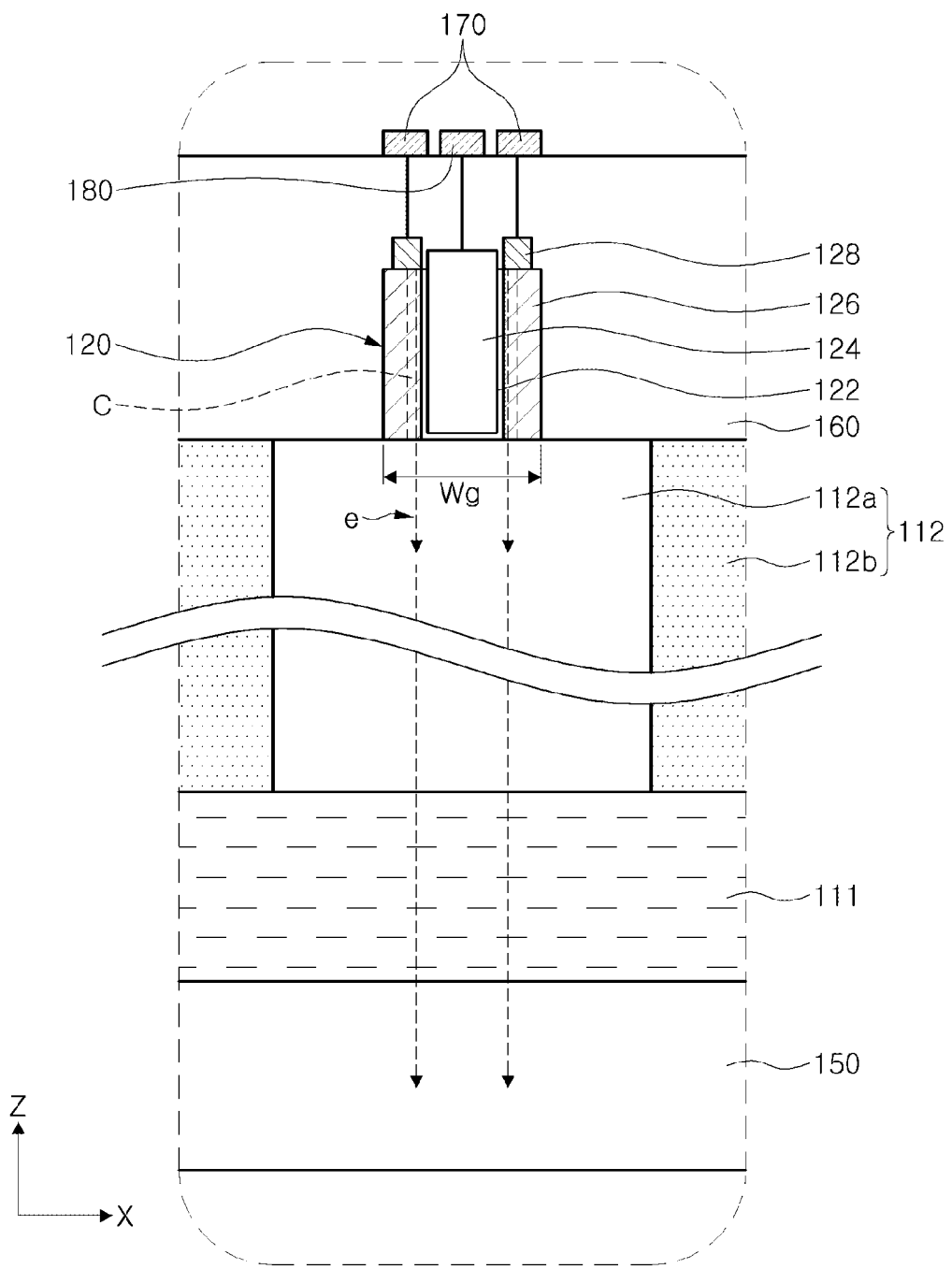
FIG. 3 is an enlarged cross-sectional view of portion A of FIG. 1.

FIG. 3 is an enlarged cross-sectional view of portion A of FIG. 1.

Referring to FIG. 3, the 3D gate portion 120 includes a gate disposed on the n-type pillar 112a, a second conductivity type well region 126 disposed on both side surfaces of the gate, and a first conductivity type source region 128 disposed on the second conductivity type well region 126.

The second conductivity type well region 126 may have a p conductivity type to form pn junction with the n-type pillar 112a.

The first conductivity type source region 128 of an n conductivity type may be disposed on the second conductivity type well region 126.

The gate may include a gate insulating layer 122 and a conductive material 124.

The gate may be disposed on the n-type pillar 112a, and the gate insulating layer 122 may be formed in a portion thereof contacting the second conductivity type well region 126. Thus, the gate may be insulated from the second conductivity type well region 126.

The gate insulating layer 122 may be formed of, but is not limited to, silicon oxide ($SiO_2$).

The conductive material 124 may fill the gate.

The height of the conductive material 124 filling the gate may be equal to or greater than the height of the second conductivity type well region 126.

The conductive material 124 may be formed of, but is not limited to, poly silicon or a metal.

The conductive material 124 is electrically connected to a gate electrode 180 to control an operation of the power semiconductor device 100 according to an exemplary embodiment in the present disclosure.

When a positive voltage is applied to the conductive material 124, a channel c is formed in the second conductivity type well region 126.

In detail, when a positive voltage is applied to the conductive material 124, electrons present in the second conductivity type well region 126 are attracted to the gate, and thus the electrons are collected at the interface between the second conductivity type well region 126 and the gate insulating layer 122 so as to form the channel c.

For example, when a (+) voltage is applied to the gate electrode 180, a well region is depleted to form an electron layer on surfaces of the second conductivity type well region 126 and the gate insulating layer 122 to form the channel c such that current flows therethrough.

The electrons may be moved to the n-type pillar 112a through the channel c and moved to the first conductivity type semiconductor substrate 111 through the n-type pillar 112a.

Thus, the 3D gate portion 120 may provide a path e for allowing for rapid movement of electrons in a direction perpendicular with respect to the first conductivity type semiconductor substrate 111.

In addition, the channel c may be formed on the power semiconductor device 100 due to the 3D gate portion 120, and thus on-resistance of the device may be reduced while reducing the widths of the n-type pillar and the p-type pillar.

The power semiconductor device 100 may further include an insulating layer 160 disposed on the super-junction portion 112 and formed to cover the 3D gate portion 120 so that the 3D gate portion 120 may be buried therein.

The insulating layer 160 may insulate the first conductivity type source region 128 from the gate.

The insulating layer 160 may be formed of, but is not limited to, silicon oxide ($SiO_2$).

A source electrode 170 may be disposed on the insulating layer 160 to be electrically connected to the first conductivity type source region 128, and a drain electrode 150 may be disposed below the first conductivity type semiconductor substrate 111.

The first conductivity type source region 128 may be connected to the source electrode 170 via a connection metal.

Figure 4:
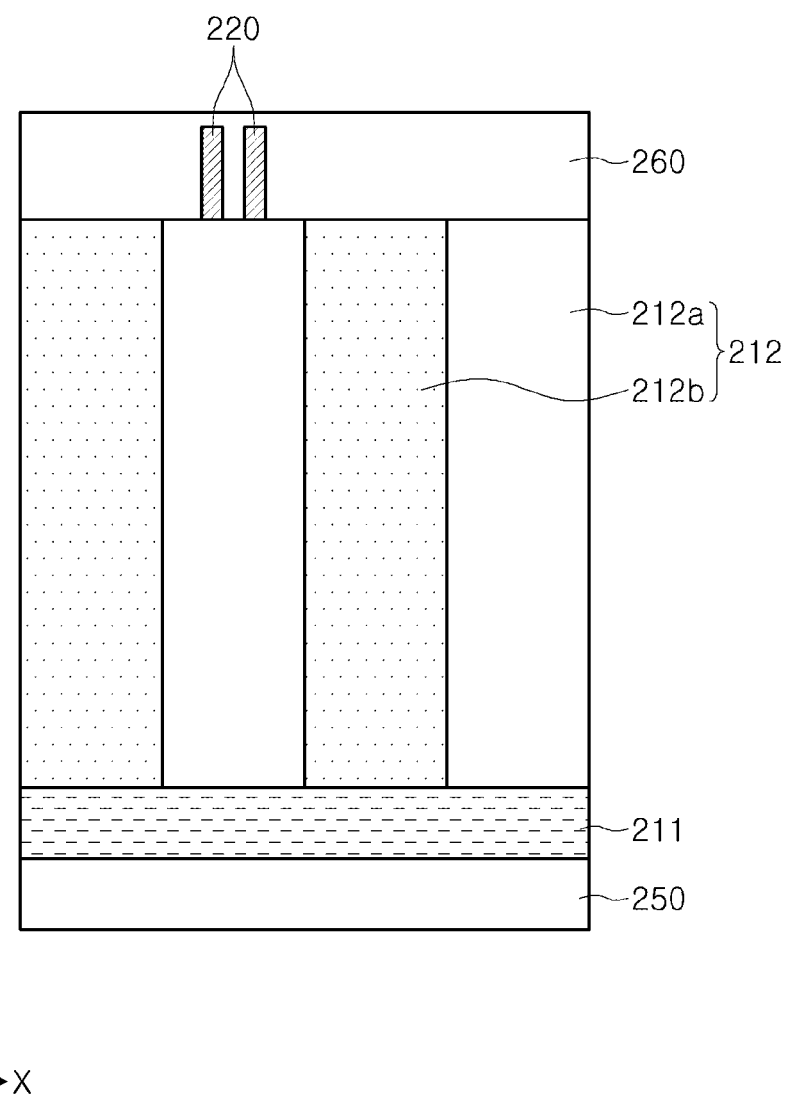
FIG. 4 is a schematic cross-sectional view of a power semiconductor device according to another exemplary embodiment in the present disclosure.

FIG. 4 is a schematic cross-sectional view of a power semiconductor device 200 according to another exemplary embodiment in the present disclosure.

A detailed description of the same components in FIG. 4 as the components illustrated in FIG. 1 will be omitted herein.

Referring to FIG. 4, in the power semiconductor device 200 according to another exemplary embodiment in the present disclosure, a 3D gate portion 220 may be only disposed on an n-type pillar 212a of the super-junction portion 212.

Since the 3D gate portion 220 has a width of 1 μm, a plurality of 3D gate portions 220 may be disposed on a single n-type pillar 212a. Thus, an area of a channel region may be increased in the power semiconductor device 200 and channel density may be enhanced.

Figure 5:
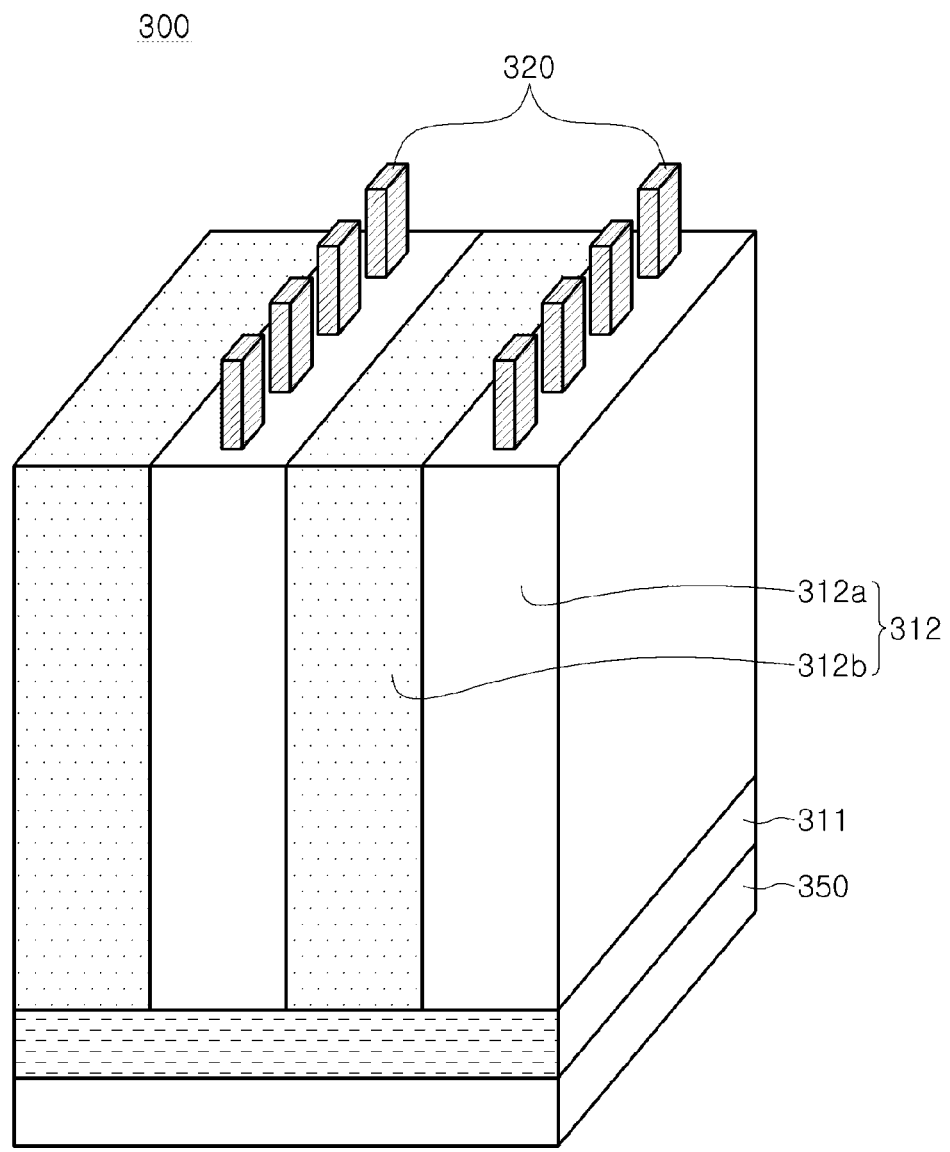
FIG. 5 is a schematic perspective view of a power semiconductor device according to another exemplary embodiment in the present disclosure.

FIG. 5 is a schematic perspective view of a power semiconductor device 300 according to another exemplary embodiment in the present disclosure.

A detailed description of the same components in FIG. 5 as the components illustrated in FIG. 1 will be omitted herein.

Referring to FIG. 5, the power semiconductor device 300 according to another exemplary embodiment in the present disclosure may include a plurality of 3D gate portions 320 that are spaced apart from each other by a predetermined interval in a direction perpendicular with respect to the width direction, on an n-type pillar 312a.

As described above, the 3D gate portion 320 may provide a path through which electrons may rapidly move in a direction perpendicular with respect to a semiconductor substrate 311, and thus on-resistance of the power semiconductor device may be reduced while reducing the widths of the n-type pillar and the p-type pillar of the power semiconductor device.

Since each of the 3D gate portions 320 has a width of 1 μm, the 3D gate portions 320 may be disposed in a width range of the n-type pillar 312a. Thus, an area of a channel region may be increased in the power semiconductor device and channel density may be enhanced.

For example, the 3D gate portions 320 may be disposed on the n-type pillar 312a, and thus the widths of the n-type pillar 312a and the p-type pillar 312b may be reduced, thereby effectively reducing a device size and increasing integration density.

As set forth above, according to exemplary embodiments of the present disclosure, a power semiconductor device having a reduced size and reduced on-resistance may be provided.

While exemplary embodiments have been shown and described above, it will be apparent to those skilled in the art that modifications and variations could be made without departing from the scope of the present invention as defined by the appended claims.

What is claimed is:

1. A power semiconductor device comprising:
   a first conductivity type semiconductor substrate;
   a super-junction portion disposed on the first conductivity type semiconductor substrate and including a first conductivity type pillar and a second conductivity type pillar arranged in an alternating manner; and
   a three-dimensional (3D) gate portion disposed on the first conductivity type pillar,
   wherein the 3D gate portion has a width equal to or less than 1 μm.

2. The power semiconductor device of claim 1, wherein the 3D gate portion includes:
   a gate disposed on the first conductivity type pillar;
   a second conductivity type first semiconductor region disposed on both side surfaces of the gate; and
   a first conductivity type second semiconductor region disposed on the first semiconductor region.

3. The power semiconductor device of claim 1, wherein the first conductivity type pillar and the second conductivity type pillar have a width of 6 to 8 μm.

4. The power semiconductor device of claim 1, wherein the 3D gate portions are longitudinally disposed in one direction on the first conductivity type pillar.

5. The power semiconductor device of claim 1, wherein the 3D gate portions are spaced apart from each other by a predetermined interval in a direction perpendicular with respect to a width direction, on the first conductivity type pillar.

6. The power semiconductor device of claim 1, wherein with respect to the 3D gate portion, one or more 3D gate portions are disposed on one first conductivity type pillar of the super-junction portion.

7. The power semiconductor device of claim 1, wherein the 3D gate portions are only disposed on one first conductivity type pillar of the super-junction portion.

8. The power semiconductor device of claim 1, further comprising an insulating layer disposed on the super-junction portion and covering the 3D gate portion to be buried in the insulating layer.

9. A power semiconductor device comprising:
   a first conductivity type semiconductor substrate;
   a super-junction portion disposed on the first conductivity type semiconductor substrate and including a first conductivity type pillar and a second conductivity type pillar arranged in an alternating manner; and
   a path provider disposed on the first conductivity type pillar and allowing electrons to move in a direction perpendicular with respect to the first conductivity type semiconductor substrate,
   wherein the path provider has a width equal to or less than 1 μm.

10. The power semiconductor device of claim 9, wherein the first conductivity type pillar and the second conductivity type pillar have a width of 6 to 8 μm.

11. The power semiconductor device of claim 9, further comprising an insulating layer disposed on the super-junction portion and covering the path provider to be buried in the insulating layer.

* * * * *